United States Patent
Guo et al.

(10) Patent No.: US 11,308,853 B2
(45) Date of Patent: Apr. 19, 2022

(54) SHIFT REGISTER AND DRIVING METHOD THEREOF, GATE DRIVING CIRCUIT AND DISPLAY APPARATUS

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Wang Guo, Beijing (CN); Yanchen Li, Beijing (CN); Yue Li, Beijing (CN); Jinyu Li, Beijing (CN); Dawei Feng, Beijing (CN); Yu Zhao, Beijing (CN); Shaojun Hou, Beijing (CN); Dong Wang, Beijing (CN); Mingyang Lv, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 640 days.

(21) Appl. No.: 16/304,952

(22) PCT Filed: Feb. 8, 2018

(86) PCT No.: PCT/CN2018/075853
§ 371 (c)(1),
(2) Date: Nov. 27, 2018

(87) PCT Pub. No.: WO2019/024481
PCT Pub. Date: Feb. 7, 2019

(65) Prior Publication Data
US 2021/0225250 A1    Jul. 22, 2021

(30) Foreign Application Priority Data
Jul. 31, 2017    (CN) .......................... 201710643411.6

(51) Int. Cl.
*G09G 3/3266* (2016.01)
*G09G 3/20* (2006.01)

(52) U.S. Cl.
CPC ... *G09G 3/2092* (2013.01); *G09G 2300/0426* (2013.01); *G09G 2310/0267* (2013.01);
(Continued)

(58) Field of Classification Search
CPC ......... G09G 3/2092; G09G 2300/0426; G09G 2310/0267; G09G 2310/0286;
(Continued)

(56) References Cited

U.S. PATENT DOCUMENTS 9,875,712 B2 *   1/2018  Ma ....................... G09G 3/3677
10,096,372 B2 * 10/2018  Chan ................... G09G 3/3266
(Continued)

FOREIGN PATENT DOCUMENTS

CN    104078017 A    10/2014
CN    106098011 A    11/2016
(Continued)

OTHER PUBLICATIONS

International Search Report of PCT/CN2018/075853 in Chinese, dated May 21, 2018, with English translation.
(Continued)

*Primary Examiner* — Jose R Soto Lopez
(74) *Attorney, Agent, or Firm* — Collard & Roe, P.C.

(57) ABSTRACT

There are provided in the present disclosure a shift register and a driving method thereof, a gate driving circuit and a display apparatus. The shift register of the present disclosure includes: a forward scanning input sub-circuit for precharging a potential of a pull-up node by an operation level signal under control of a forward input signal and a forward scanning signal upon scanning forwards; a backward scanning input sub-circuit for pre-charging the potential of the
(Continued)

pull-up node by an operation level signal under control of a backward input signal and a backward scanning signal upon scanning backwards; an output sub-circuit for outputting a clock signal through a signal output terminal under control of the potential of the pull-up node; wherein the pull-up node is a connection node of the forward scanning input sub-circuit, the backward scanning input sub-circuit and the output sub-circuit.

19 Claims, 6 Drawing Sheets

(52) U.S. Cl.
CPC .............. *G09G 2310/0286* (2013.01); *G09G 2310/061* (2013.01); *G09G 2310/08* (2013.01)

(58) Field of Classification Search
CPC ......... G09G 2310/061; G09G 2310/08; G09G 2300/0408; G09G 2310/0283; G09G 3/3677; G11C 19/28
See application file for complete search history.

(56) References Cited

U.S. PATENT DOCUMENTS

| | | | | |
|---|---|---|---|---|
| 10,249,243 | B2* | 4/2019 | Li | G09G 3/3266 |
| 10,255,869 | B2* | 4/2019 | Li | G09G 3/3648 |
| 2002/0167026 | A1* | 11/2002 | Azami | G11C 19/28 |
| | | | | 257/200 |
| 2013/0148775 | A1* | 6/2013 | Shin | G11C 19/28 |
| | | | | 377/69 |
| 2014/0072093 | A1* | 3/2014 | Shang | G09G 3/20 |
| | | | | 377/69 |
| 2014/0184304 | A1* | 7/2014 | Huang | G09G 3/20 |
| | | | | 327/379 |
| 2015/0109353 | A1* | 4/2015 | Yu | G11C 19/28 |
| | | | | 345/691 |
| 2015/0279481 | A1* | 10/2015 | Sasaki | G11C 19/28 |
| | | | | 377/69 |
| 2015/0317936 | A1* | 11/2015 | Yang | G09G 3/3677 |
| | | | | 345/100 |
| 2015/0332784 | A1* | 11/2015 | Yan | G09G 3/3677 |
| | | | | 377/64 |
| 2015/0371716 | A1* | 12/2015 | Shao | G11C 19/287 |
| | | | | 345/100 |
| 2016/0049126 | A1* | 2/2016 | Zhang | G09G 3/3696 |
| | | | | 345/173 |
| 2016/0086562 | A1* | 3/2016 | Tan | G09G 3/3677 |
| | | | | 345/215 |
| 2016/0093264 | A1* | 3/2016 | Gu | G09G 3/3677 |
| | | | | 345/212 |
| 2016/0104449 | A1* | 4/2016 | Huang | G11C 19/287 |
| | | | | 345/212 |
| 2016/0275902 | A1* | 9/2016 | Xue | G09G 3/3266 |
| 2017/0221441 | A1* | 8/2017 | Gu | G09G 3/3677 |
| 2017/0285375 | A1* | 10/2017 | Iwase | G09G 3/3677 |
| 2018/0114584 | A1* | 4/2018 | Ochiai | G09G 3/3677 |
| 2018/0122320 | A1* | 5/2018 | Sasaki | G09G 3/3688 |
| 2018/0277052 | A1* | 9/2018 | Miao | G09G 3/3677 |
| 2018/0301075 | A1* | 10/2018 | Zhou | G09G 3/20 |
| 2018/0350444 | A1* | 12/2018 | Pai | H03K 19/01728 |
| 2019/0103167 | A1* | 4/2019 | Zeng | G09G 3/3677 |

FOREIGN PATENT DOCUMENTS

| | | |
|---|---|---|
| CN | 106448536 A | 2/2017 |
| CN | 107331418 A | 11/2017 |

OTHER PUBLICATIONS

Notice of Transmittal of the International Search Report of PCT/CN2018/075853 in Chinese, dated May 21, 2018.
Written Opinion of the International Searching Authority of PCT/CN2018/075853 in Chinese, dated May 21, 2018 with English translation.

* cited by examiner

SHIFT REGISTER AND DRIVING METHOD THEREOF, GATE DRIVING CIRCUIT AND DISPLAY APPARATUS

CROSS-REFERENCE TO RELATED APPLICATION

This application is the National Stage of PCT/CN2018/075853 filed on Feb. 8, 2018, which claims priority under 35 U.S.C. § 119 of Chinese Application No. 201710643411.6 filed on Jul. 31, 2017, the disclosure of which is incorporated by reference.

TECHNICAL FIELD

The present disclosure relates to a shift register unit, a gate driving circuit and a display apparatus.

BACKGROUND

A TFT-LCD driver mainly comprises a data driver and a gate driver. The gate driving circuit may be disposed in a display panel by means of packaging of Chip On Film (COF) or Chip On Glass (COG), or may be formed in a display panel by using TFTs to constitute an integrated circuit unit. The gate driving circuit generally has a structure that one electrode of a shift register is butted joint with one gate line. A signal is input through the gate driving circuit, so that progressive scanning of pixels is realized. Being different from a conventional COF or COG design, the gate driver GOA design can enable a liquid crystal display panel to have a lower cost, and at the same time reduce one process, thereby raising production. With the development of panel display, high resolution and narrow frame become a trend of development. In order to realize high-resolution and narrow-frame display, integrating the gate driving circuit on the panel is a solution.

SUMMARY

According to one aspect of the present disclosure, there is provided a shift register, comprising: a forward scanning input sub-circuit for pre-charging a potential of a pull-up node by an operation level signal under the control of a forward input signal and a forward scanning signal during forward scanning; a backward scanning input sub-circuit for pre-charging the potential of the pull-up node by an operation level signal under the control of a backward input signal and a backward scanning signal during backward scanning; an output sub-circuit for outputting a clock signal through a signal output terminal under the control of the potential of the pull-up node; wherein the pull-up node is a connection node of the forward scanning input sub-circuit, the backward scanning input sub-circuit and the output sub-circuit.

In some embodiments, the shift register further comprises: a forward scanning reset sub-circuit for resetting the pull-up node by a non-operation level signal under the control of a forward reset signal and the forward scanning signal during forward scanning; a backward scanning reset sub-circuit for resetting the pull-up node by the non-operation level signal under the control of a backward reset signal and the backward scanning signal during backward scanning.

In some embodiments, the shift register further comprises: a pull-down control sub-circuit for controlling a potential of a pull-down node under the control of the operation level and the potential of the pull-up node; a pull-down sub-circuit for pulling down the potential of the pull-down node by the non-operation level signal under the control of the potential of the pull-up node; a noise reduction sub-circuit for reducing an output noise of the pull-up node and the signal output terminal by the non-operation level signal under the control of the pull-down node; wherein the pull-down node is a connection node of the pull-down control sub-circuit, the pull-down sub-circuit and the noise reduction sub-circuit.

In some embodiments, the forward scanning input sub-circuit comprises: a first forward scanning input transistor and a second forward scanning input transistor; wherein a control electrode of the second forward scanning input transistor is connected to a forward scanning input terminal, a first electrode of the second forward scanning input transistor is connected to a second electrode of the first forward scanning input transistor, and a second electrode of the second forward scanning input transistor is connected to the pull-up node; a control electrode of the first forward scanning input transistor is connected to a first electrode thereof, and is connected to a forward scanning control terminal.

In some embodiments, the backward scanning input sub-circuit comprises: a first backward scanning input transistor and a second backward scanning input transistor; wherein a control electrode of the first backward scanning input transistor is connected to a first electrode thereof, and is connected to a backward scanning control terminal; a control electrode of the second backward scanning input transistor is connected to a backward scanning input terminal, a first electrode of the second backward scanning input transistor is connected to a second electrode of the first backward scanning input transistor, and a second electrode of the second backward scanning input transistor is connected to the pull-up node.

In some embodiments, the forward scanning reset sub-circuit comprises: a first forward scanning reset transistor and a second forward scanning reset transistor; wherein a first electrode of the first forward scanning reset transistor is connected is to the pull-up node, a second electrode of the first forward scanning reset transistor is connected to a first electrode of the second forward scanning reset transistor, and a control electrode of the first forward scanning reset transistor is connected to the backward scanning input terminal; a first electrode of the second forward scanning reset transistor is connected to the second electrode of the first forward scanning reset transistor, a second electrode of the second forward scanning reset transistor is connected to the backward scanning control terminal, and a control electrode of the second forward scanning reset transistor is connected to the forward scanning control terminal.

In some embodiments, the backward scanning reset sub-circuit comprises: a first backward scanning reset transistor and a second backward scanning reset transistor; wherein a first electrode of the first backward scanning reset transistor is connected to a second electrode of the second backward scanning reset transistor, a second electrode of the first backward scanning reset transistor is connected to the pull-up node, and a control electrode of the first backward scanning reset transistor is connected to the forward scanning input terminal; a first electrode of the second backward scanning reset transistor is connected to the forward scanning control terminal, a second electrode of the second backward scanning reset transistor is connected to the first electrode of the first backward scanning reset transistor, and a control electrode of the second backward scanning reset transistor is connected the backward scanning control terminal.

In some embodiments, the output sub-circuit comprises an output transistor and an output capacitor; wherein a control electrode of the output transistor is connected to the pull-up node, a first terminal of the output transistor is connected to a first clock signal terminal, and a second terminal of the output transistor is connected to an output terminal; a first terminal of the output capacitor is connected to the pull-up node, and a second terminal of the output capacitor is connected to the output terminal.

In some embodiments, the pull-down control sub-circuit comprises a first pull-down control transistor and a second pull-down control transistor; wherein a first electrode of the first pull-down control transistor is connected to a first electrode of the second pull-down control transistor, a second electrode of the first pull-down control transistor is connected to the pull-down node, and a control electrode of the first pull-down control transistor is connected to a second electrode of the second pull-down control transistor; both the first electrode and a control electrode of the second pull-down control transistor are connected to a first control signal terminal, and the second electrode of the second pull-down control transistor is connected to the control electrode of the first pull-down control transistor and the pull-down sub-circuit.

In some embodiments, the pull-down sub-circuit comprises: a first pull-down transistor and a second pull-down transistor; wherein a first electrode of the first pull-down transistor is connected to the pull-down node, a second electrode of the first pull-down transistor is connected to a low level terminal, and a control electrode of the first pull-down transistor is connected to the pull-up node; a first electrode of the second pull-down transistor is connected to the pull-down control sub-circuit, a second electrode of the second pull-down transistor is connected to the low level terminal, and a control electrode of the second pull-down transistor is connected to the pull-up node.

In some embodiments, the noise reduction sub-circuit comprises: a first noise reduction transistor and a second noise reduction transistor; wherein a first electrode of the first noise reduction transistor is connected to the pull-up node, a second electrode of the first noise reduction transistor is connected to a second control signal terminal, and a control electrode of the first noise reduction transistor is connected to the pull-down node; a first electrode of the second noise reduction transistor is connected to the pull-up node, a second electrode of the second noise reduction transistor is connected to the second control signal terminal, and a control electrode of the second noise reduction transistor is connected to the pull-down node.

In some embodiments, the shift register further comprises: an output reset sub-circuit for resetting a signal output by the signal output terminal by the non-operation level signal under the control of a second control signal after scanning of each frame ends up.

In some embodiments, the output reset sub-circuit comprises: an output reset transistor, wherein a first electrode of the output reset transistor is connected to the signal output terminal, a second electrode of the output reset transistor is connected to a low level signal terminal, and a control electrode of the output reset transistor is connected to the second control signal terminal.

According to another aspect of the present disclosure, there is further provided a driving method of the shift register as described above, comprising: during a forward scanning pre-charge phase, pre-charging the pull-up node by adopting a forward scanning input sub-circuit; during a backward scanning pre-charge phase, pre-charging the pull-up node by adopting a backward scanning input sub-circuit.

In some embodiments, the driving method further comprises: during a forward scanning reset phase, resetting the pull-up node by adopting a forward scanning reset sub-circuit; during a backward scanning reset phase, resetting the pull-up node by adopting a backward scanning reset sub-circuit.

In some embodiments, the forward scanning pre-charge phase comprises: controlling the forward scanning input sub-circuit to be turned on by a forward input signal provided by a first signal terminal and an operation level signal provided by a forward scanning control terminal, and pre-charging the pull-up node by the operation level signal provided by the forward scanning control terminal; the backward scanning pre-charging phase comprises: controlling the backward scanning input sub-circuit to be turned on by a backward input signal provided by a second signal terminal and an operation level signal provided by the backward scanning control terminal, and pre-charging the pull-up node by the operation level signal provided by the backward scanning control terminal.

In some embodiments, the forward scanning reset phase comprises: controlling the forward scanning reset sub-circuit to be turned on by a forward reset signal provided by the second signal terminal and the operation level signal provided by the forward scanning control terminal, and resetting the pull-up node by a non-operation level signal provided by the backward scanning control terminal; the backward scanning reset phase comprises: controlling the backward scanning reset sub-circuit to be turned on by a backward reset signal provided by the first signal terminal and an operation level signal provided by the backward scanning control terminal, and resetting the pull-up node by a non-operation level signal provided by the forward scanning control terminal.

According to another aspect of the present disclosure, there is further provided a gate driving circuit, comprising multiple shift registers connected in cascades, wherein the shift register is the shift register unit as described above.

According to another aspect of the present disclosure, there is further provided a display apparatus, comprising the gate driving circuit as described above.

The shift register of the present disclosure comprises the forward scanning input module and the forward scanning reset module used for scanning forwards, and the backward scanning input module and the backward scanning reset module used for scanning backwards, i.e., using different input modules and reset modules respectively when forward scanning and backward scanning are performed on the display panel, so that the input signal and the reset signal are switched into different circuits upon scanning forwards and scanning backwards, so as to ensure that current directions of the forward scanning input module and the forward scanning reset module used for scanning forwards as well as the backward scanning input module and the backward scanning reset module used for backward scanning are unchanged in the operation state, thereby solving the problem of poor reliability in horizontal strip in the existing shift register.

DETAILED DESCRIPTION

In order to make those skilled in the art understand technical solutions of the present disclosure better, the present disclosure will be further described below in detail by combining with the accompanying figures and specific implementations.

Transistors adopted in embodiments of the present disclosure may be thin film transistors or field effect transistors or other devices having the same characteristics. Since sources and drains of transistors adopted may be exchanged with each other under certain conditions, sources and drains of the transistors have no distinction in terms of description of connection relationship. In the embodiment of the present disclosure, in order to distinguish sources and drains of the transistors, one electrode thereof is called as a first electrode, the other electrode thereof is called as a second electrode, and a gate thereof is called as a control electrode. In addition, the transistors may be divided into N type and P type according to characteristics of the transistors. The following embodiments are described by taking the transistors being N type transistors as an example. When an N type transistor is adopted, a first electrode is a drain of the N type transistor, a second electrode is a source of the N type transistor, and the source and the drain are turned on when a gate is input a high level; a P type transistor is opposite to the N type transistor. It could be considered that adopting a transistor as a P type transistor to implement may be easily conceived by those skilled in the art without paying any inventive labor, and thus it also falls into the protection scope of embodiments of the present disclosure.

In the embodiments provided in the present disclosure, an operation level refers to a high level signal, and a non-operation level refers to a low level signal. Those skilled in the art may understand that driving sequences of the transistors may be changed depending on the actual situations so as to realize principles provided in the present disclosure when the embodiments described in the present disclosure are implemented by adopting different types of transistors.

Figure 1:
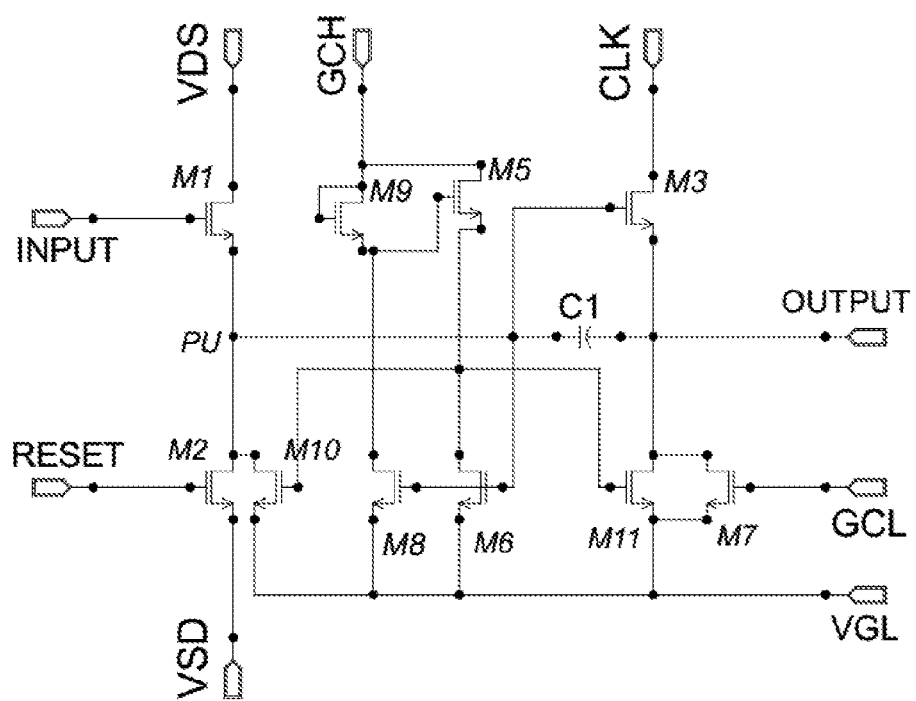
FIG. 1 is a schematic diagram of structure of an existing shift register.

FIG. 1 shows a schematic diagram of structure of an existing shift register. The shift register is composed of ten transistors and one output capacitor. The inventor(s) finds that when the shift registers switch from forward scanning to backward scanning, the directions of the current of two signals input to a control signal input terminal and a reset signal terminal would change in transistors, which would cause that, under the condition of high temperature, poor reliability in horizontal strip occurs to the shift register when the shift register switches to backward scanning after scanning forwards for a long period of time.

Figure 2:
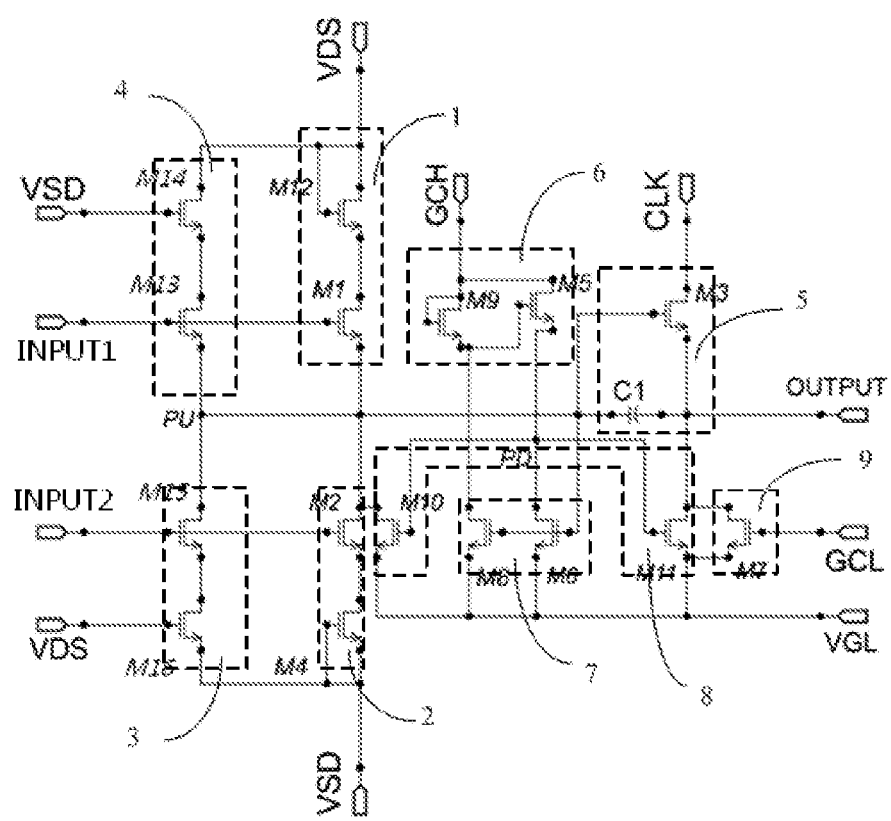
FIG. 2 is a schematic diagram of a shift register of one embodiment of the present disclosure.

FIG. 2 is a schematic diagram of shift register according to an embodiment of the present disclosure. As shown in FIG. 2, there is provided in the present disclosure a shift register, comprising; a forward scanning input sub-circuit 1, a backward scanning input sub-circuit 2, and an output sub-circuit 5.

Herein, a first terminal of the forward scanning input sub-circuit 1 is connected to a forward scanning control terminal VDS, a second terminal thereof is connected to a forward scanning input terminal INPUT1, and a third terminal thereof is connected to a pull-up node PU. A first terminal of the backward scanning input sub-circuit 2 is connected to a backward scanning control terminal VSD, a second terminal thereof is connected to a backward scanning input terminal INPUT2, and a third terminal thereof is connected to the pull-up node PU.

Herein, during the operation that the shift resister unit performs forward scanning, the forward scanning input module 1 inputs a forward input signal to the pull-up node PU under the control of the forward scanning control terminal. At the same time, during the operation of forward scanning, the backward scanning input sub-circuit 2 is configured to be in a non-operation state under the control of a backward scanning control signal input by the backward scanning control terminal VSD.

During the operation that the shift register unit performs backward scanning, the backward scanning input sub-circuit 2 inputs a backward input signal to the pull-up node PU under the control of the backward scanning control terminal. At the same time, during the operation of backward scanning, the forward scanning input sub-circuit 1 is configured to be in a non-operation state under the control of a forward scanning control signal input by the forward scanning control terminal VDS.

The output sub-circuit 5 is used to output a clock signal input by a first clock signal terminal CLK through the signal output terminal OUTPUT under the control of a potential of the pull-up node PU.

In some embodiments, the forward scanning input sub-circuit 1 comprises a first forward scanning input transistor M12 and a second forward scanning input transistor M1. Herein, a control electrode of the first forward scanning input transistor M12 is connected to a first electrode, and is connected to the forward scanning control terminal VDS. A control electrode of the second forward scanning input transistor M1 is connected to the forward scanning input terminal INPUT1, a first electrode thereof is connected to a second electrode of the first forward scanning input transistor M12, and a second electrode thereof is connected to the pull-up node PU.

In some embodiments, the backward scanning input sub-circuit 2 comprises a first backward scanning input transistor M4 and a second backward scanning input transistor M2. Herein, a control electrode of the first backward scanning input transistor M4 is connected to a first electrode and is connected to the backward scanning control terminal VSD. A control electrode of the second backward scanning input terminal M2 is connected to the backward scanning input terminal INPUT2, a first electrode thereof is connected to the second electrode of the first backward scanning input transistor M12, and a second electrode thereof is connected to the pull-up node PU.

In some embodiments, the output sub-circuit 5 comprises an output transistor M3 and an output capacitor C1. Herein, a control electrode of the output transistor M3 is connected to the pull-up node PU, a first terminal thereof is connected to the first clock signal terminal CLK, and a second terminal thereof is connected to the output terminal OUTPUT. A first terminal of the output capacitor C1 is connected to the pull-up node PU, and a second terminal thereof is connected to the output terminal OUTPUT.

As shown in FIG. 2, in some embodiments, the shift register unit may further comprise: a forward scanning reset sub-circuit 3, a backward scanning reset sub-circuit 4, a pull-down control sub-circuit 6, a pull-down sub-circuit 7, and a noise reduction circuit 8.

Herein, the forward scanning reset sub-circuit 3 is used to reset the pull-up node PU by a non-operation level signal under the control of a forward reset signal and a forward scanning signal upon scanning forwards.

In some embodiments, the forward scanning rest sub-circuit 3 may comprise: a first forward scanning reset transistor M15 and a second forward scanning reset transistor M16. Herein, a first electrode of the first forward scanning reset transistor M15 is connected to the pull-up node PU, a second electrode thereof is connected to a first electrode of the second forward scanning reset transistor M16, and a control electrode thereof is connected to the backward scanning input terminal INPUT2. The first electrode of the second forward scanning reset transistor M16 is connected to the second electrode of the first forward scanning reset transistor M15, and a second electrode thereof is connected to the backward scanning control terminal VSD, and a control electrode thereof is connected to the forward scanning control terminal VDS.

The backward scanning reset sub-circuit 4 is used to reset the pull-up node PU by the non-operation level signal under the control of the backward reset signal and the backward scanning signal upon scanning backwards.

In some embodiments, the backward scanning reset sub-circuit 4 may comprise: a first backward scanning reset transistor M13 and a second backward scanning reset transistor M14. Herein, a first electrode of the first backward scanning reset transistor M13 is connected to a second electrode of the second backward scanning reset transistor M14, a second electrode thereof is connected to the pull-up node PU, and a control electrode thereof is connected to the forward scanning input terminal INPUT1. A first electrode of the second backward scanning reset transistor M14 is connected to the forward scanning control terminal VDS, and the second electrode thereof is connected to the first electrode of the first backward scanning reset transistor M13, and a control electrode thereof is connected to the backward scanning control terminal VSD.

The pull-down control sub-circuit 6 is used to control a potential of the pull-down node PD under the control of the operation level and the potential of the pull-up node PU. The pull-down node PD is a connection node between the pull-down control sub-circuit 6, the pull-down sub-circuit 7, and the noise reduction sub-circuit 8.

In some embodiments, the pull-down control sub-circuit 6 comprises a first pull-down control transistor M5 and a second pull-down control transistor M9. Herein, a first electrode of the first pull-down control transistor M5 is connected to a first electrode of the second pull-down control transistor M9, a second electrode thereof is connected to the pull-down node PD, and a control electrode thereof is connected to a second electrode of the second pull-down control transistor M9. Both the first electrode and a control electrode of the second pull-down control transistor M9 are connected to a first control signal terminal GCH, and the second electrode thereof is connected to the control electrode of the first pull-down control transistor M5 and the pull-down sub-circuit 7. In some embodiments, the first control signal terminal GCH may be input a high level signal.

The pull-down sub-circuit 7 is used to pull down the potential of the pull-down node PD by the non-operation level signal under the content of the potential of the pull-up node PU.

In some embodiments, the pull-down sub-circuit 7 comprises: a first pull-down transistor M6 and a second pull-down transistor M8. Herein, a first electrode of the first pull-down transistor M6 is connected to the pull-down node PD, a second electrode thereof is connected to the low level terminal, and a control electrode thereof is connected to the pull-up node PU. A first electrode of the second pull-down transistor M8 is connected to the pull-down control sub-circuit 6, a second electrode thereof is connected to the low level terminal, and a control electrode thereof is connected to the pull-up node PU.

The noise reduction sub-circuit 8 is used to reduce an output noise of the pull-up node PU and the signal output terminal OUTPUT by the non-operation level signal under the control of the pull-down node PD.

In some embodiments, the noise reduction sub-circuit 8 comprises: a first noise reduction transistor M10 and a second noise reduction transistor M11. Herein, a first electrode of the first noise reduction transistor M10 is connected to the pull-up node PU, a second electrode thereof is connected to the second control signal terminal VGL, and a control electrode thereof is connected to the pull-down node PD. A first electrode of the second noise reduction transistor M11 is connected to the pull-up node PU, a second electrode thereof is connected to the second control signal terminal VGL, and a control electrode thereof is connected to the pull-down node PD. A first electrode of the second noise reduction transistor M11 is connected to the pull-up node PU, a second electrode thereof is connected to the second control signal terminal VGL, and a control electrode thereof is connected to pull-down node PD. In some embodiments, the second control signal terminal VGL may be input a low level signal.

In some embodiments, the shift register unit as shown in FIG. 2 may further comprise an output reset sub-circuit 9, which is used to reset a signal output by the signal output terminal OUTPUT by the non-operation level signal under the control of the second control signal after scanning of each frame ends up.

For example, the output reset sub-circuit 9 may comprise: an output reset transistor M17. Herein, a first electrode of the output reset transistor M7 is connected to the signal output terminal OUTPUT, a second electrode thereof is connected to the low level signal terminal, and a control electrode thereof is connected to the second control signal terminal GCL.

The shift register provided in the present disclosure comprises the forward scanning input sub-circuit 1 and the forward scanning reset sub-circuit 3 used for scanning forwards, and the backward scanning input sub-circuit 2 and the backward scanning reset sub-circuit 4 used for scanning backwards, i.e., different input sub-circuits and reset sub-circuits are used respectively when forward scanning and backward scanning are performed on the display panel, so that the input signal and the reset signal are switched to different circuits upon scanning forwards and scanning backwards, so as to ensure that current directions of the forward scanning input sub-circuit 1 and the forward scanning reset sub-circuit 3 used for scanning forwards, as well as the backward scanning input sub-circuit 2 and the backward scanning reset sub-circuit 4 used for scanning backwards do not change in the operation state, thereby solving the problem of poor reliability in horizontal strip in the existing shift register.

Figure 3:
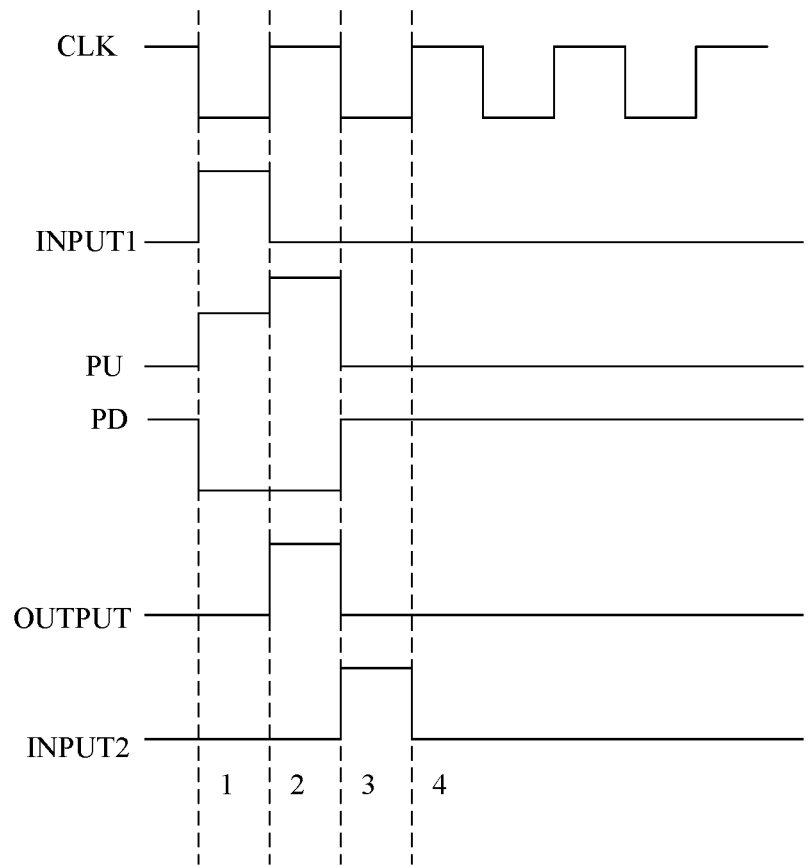
FIG. 3 is a timing diagram of forward scanning in a driving method of a shift register of one embodiment of the present disclosure.

FIG. 3 shows a timing diagram of a shift register during the time period of forward scanning according to an embodiment of the present disclosure.

During the time period of forward scanning, the signal input by the forward scanning control terminal VDS is a constant high signal, and the signal input by the backward scanning input terminal VSD is a constant low signal. In a forward scanning pre-charge phase, the forward scanning input terminal INPUT1 is input a high level signal, so that the second forward scanning input transistor M1 and the first forward scanning input transistor M12 are turned on and pre-charge the pull-up node PU by the high level signal input by the forward scanning control terminal VDS. At this time, the first backward scanning input transistor M4 is turned off under the control of the backward scanning control terminal VSD, so that the backward scanning input sub-circuit 2 is in the non-operation state during the time period of forward scanning.

After the pull-up node PU is pre-charged to the high level, the output transistor M3 is turned on under the control of the pull-up node PU. At the same time, the first clock signal terminal CLK is written into the high level signal, and the signal output terminal OUTPUT outputs the high level signal.

In a forward scanning reset phase, the backward scanning input terminal INPUT2 is input the high level signal, the signal input by the forward scanning control terminal VDS is a constant high signal, and the signal input by the backward scanning control terminal VSD is a constant low signal. Therefore, the first forward scanning reset transistor M15 and the second forward scanning reset transistor M16 are turned on, and pull down the potential of the pull-up node PU by the low level signal input by the backward scanning control terminal VSD, so as to complete resetting of the pull-up node PU.

Figure 4:
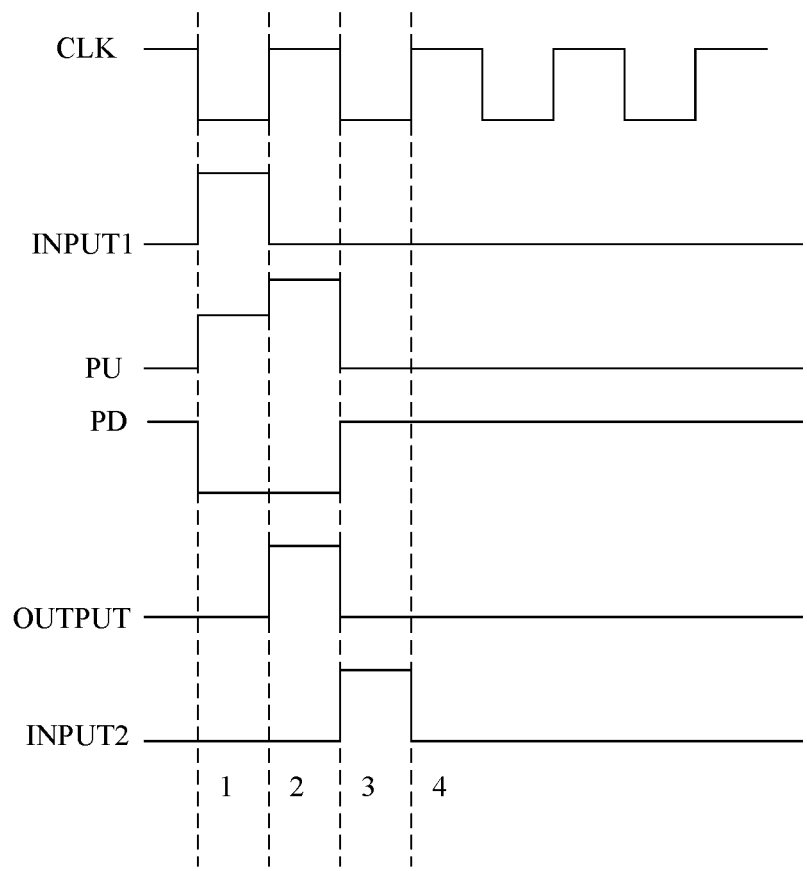
FIG. 4 is a timing diagram of backward scanning in a driving method of a shift register of one embodiment of the present disclosure.

FIG. 4 shows a timing diagram of a shift register during a time period of backward scanning according to an embodiment of the present disclosure.

During the time period of backward scanning, a signal input by the backward scanning control terminal VSD is a constant high signal, and a signal input by the forward scanning control terminal VDS is a constant low signal. In a backward scanning pre-charge phase, the backward scanning input terminal INPUT2 is input the high level signal, and thus the second backward scanning input transistor M2 and the first backward scanning input transistor M4 are turned on, and pre-charge the pull-up node PU by the high level signal input by the backward scanning control terminal. At this time, the first forward scanning input transistor M12 is turned off under the control of the forward scanning control terminal VDS, so that the forward scanning input sub-circuit 1 is in the non-operation state during the time period of backward scanning.

After the pull-up node PU is pre-charged to the high level, the output transistor M3 is turned on under the control of the pull-up node PU. At the same time, the first clock signal terminal CLK is written into the high level signal, and the signal output terminal OUTPUT outputs the high level signal.

In a backward scanning reset phase, the forward scanning input terminal INPUT is input a high level signal. At the same time, upon scanning backwards, the signal input by the forward scanning control terminal VDS is a constant low signal, and the signal input by the backward scanning control terminal VSD is a constant high signal. Therefore, the first backward scanning reset transistor M13 and the second backward scanning reset transistor M14 are turned on, and pulls down the potential of the pull-up node PU by the low level signal input by the forward scanning control terminal VDS, so as to complete resetting of the pull-up node PU.

In the above embodiment, description is given by taking the first control signal terminal GCH being input a constant high signal as an example. The first pull-down control transistor M5 and the second pull-down control transistor M9 are turned on, and the potential of the pull-down node PD is pulled to a high potential. Of course, the signal input by the first control signal terminal may also be a clock signal, only if the clock signal and the signal input by the first clock signal terminal CLK have a difference of half period.

When the pull-up node PU is at a high potential, the first pull-down transistor M6 and the second pull-down transistor M8 are turned on, the pull-down node PD is pulled down to the low level by the low level signal input by the low level signal terminal, and at the same time, the output of the pull-down control sub-circuit 6 is also pulled down to the low level.

When the pull-down node PD is at a high level, the first noise reduction transistor M10 and the second noise reduction transistor M11 are turned on under the control of the pull-down node PD, and reduce the noise of the pull-up node PU and the signal output by the signal output terminal OUTPUT by the low level signal input by the low level signal terminal.

After scanning of one frame, the outputs of respective shift registers need to be reset. Therefore, after scanning of one frame is completed, the high level signal is input to the second control signal terminal GCL, so that the output reset transistor M7 is turned on, and the output of the signal output terminal OUTPUT is pulled down by the low level signal input by the low level signal terminal. At this time, the high level signal input by the first control signal terminal GCH may be reversed to the low level.

Figure 5A:
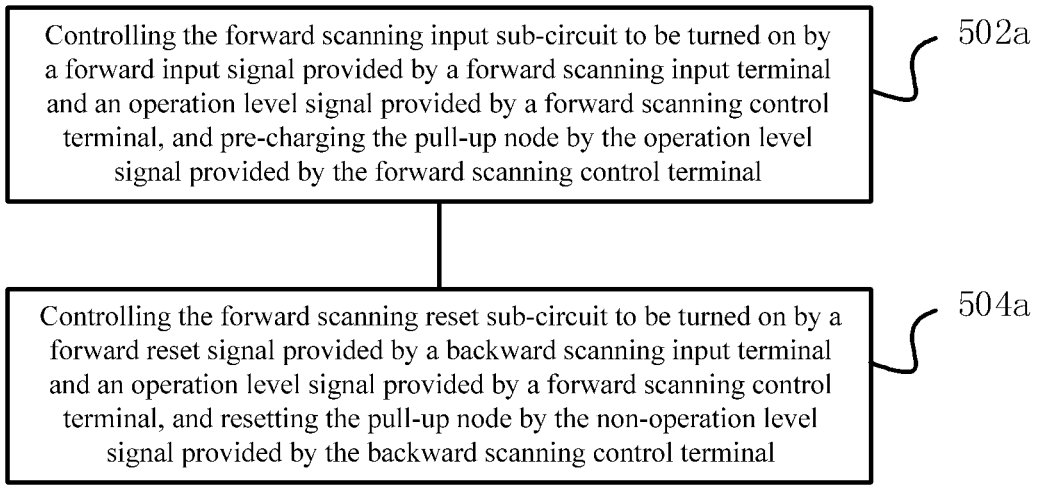
FIG. 5a is a flow diagram of an exemplary driving method of a shift register according to an embodiment of the present disclosure.
Figure 5B:
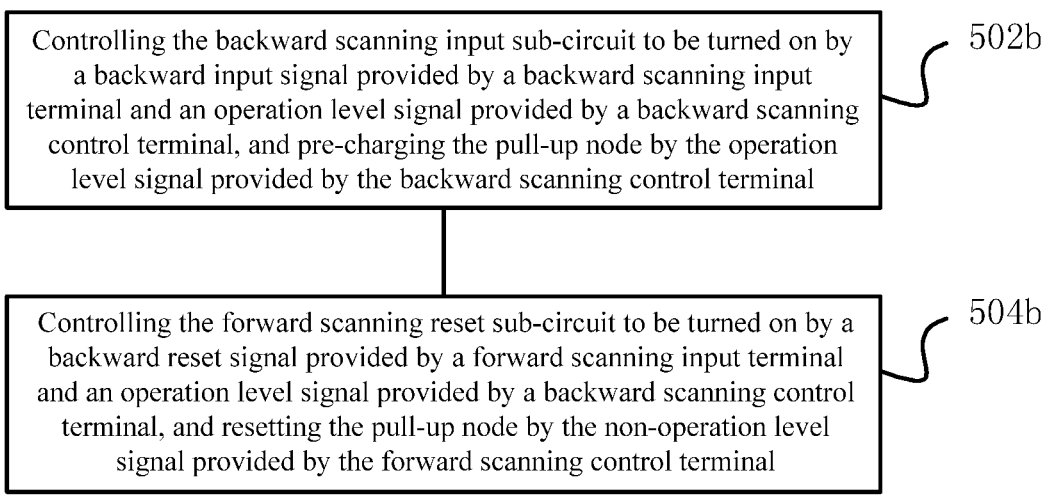
FIG. 5b is a flow diagram of an exemplary driving method of a shift register according to an embodiment of the present disclosure.

FIGS. 5a and 5b are flow diagrams of an exemplary driving method of a shift register according to an embodiment of the present disclosure. This method is capable of being used to drive the shift register in the previous embodiment to operate. FIG. 5a is a flow diagram of a driving method of a shift register during forward scanning. FIG. 5b is a flow diagram of a driving method of a shift register during backward scanning;

For example, in a forward scanning pre-charge phase, the pull-up node PU is pre-charged by adopting a forward scanning input sub-circuit 1. In a backward scanning pre-charge phase, the pull-up node PU is pre-charge by adopting a backward scanning input sub-circuit 2.

For example, in the forward scanning pre-charge phase, the driving method may comprise:

controlling the forward scanning input sub-circuit to be turned on by a forward input signal provided by a forward scanning input terminal and an operation level signal provided by a forward scanning control terminal, and pre-charging the pull-up node by the operation level signal provided by the forward scanning control terminal.

In the backward scanning pre-charge phase, the driving method may comprise:

controlling the backward scanning input sub-circuit to be turned on by a backward input signal provided by a forward scanning input terminal and an operation level signal provided by a backward scanning control terminal, and precharging the pull-up node by the operation level signal provided by the backward scanning control terminal.

In a forward scanning reset phase, the pull-up node PU is reset by adopting a forward scanning reset sub-circuit. In a backward scanning reset phase, the pull-up node PU is reset by adopting a backward scanning reset sub-circuit 4.

In the forward scanning reset phase, the driving method may comprise:

controlling the forward scanning reset sub-circuit to be turned on by a forward reset signal provided by the backward scanning input terminal and an operation level signal provided by a forward scanning control terminal, and resetting the pull-up node by the non-operation level signal provided by the backward scanning control terminal.

In the backward scanning reset phase, the driving method may comprise:

controlling the backward scanning reset sub-circuit to be turned on by a backward reset signal provided by the forward scanning input terminal and an operation level signal provided by a backward scanning control terminal, and resetting the pull-up node by the non-operation level signal provided by the forward scanning control terminal.

By combining with FIG. 2 and timing diagrams of FIGS. 3 and 4, the driving method of the shift register of the present embodiment will be described below.

Herein, the forward scanning input terminal is used to provide a forward input signal upon scanning forwards and provide a backward reset signal upon scanning backwards. The backward scanning input terminal is used to provide a forward reset signal upon scanning forwards and provide a backward input signal upon scanning backwards. The forward scanning control terminal is used to provide an operation level signal upon scanning forwards and provide a non-operation level signal upon scanning backwards. The backward scanning control terminal is used to provide the non-operation level signal upon scanning forwards and provide the operation level signal upon scanning backwards.

Forward scanning: the forward scanning control signal input by the forward scanning control terminal VDS is a constant high signal; the backward scanning control signal input by the backward scanning control terminal VSD is a constant low signal.

First phase (pre-charge phase): the forward scanning input terminal INPUT1 is input a high level signal, the forward scanning control terminal VDS is input a high level signal, and both the first forward scanning input transistor M1 and the second forward scanning input transistor M12 are turned on. At this time, the pull-up node PU is pre-charged by the high level signal input by the forward scanning control terminal, and at the same time the output capacitor C1 is charged. The output transistor M3 is turned on under the control of the high level of the pull-up node PU. At this time, the low level signal input by the first clock signal terminal CLK is output through the signal output terminal OUTPUT.

Second phase (output phase): the signal input by the forward scanning input terminal INPUT1 changes from the high level into the low level, and controls the first forward scanning input transistor M1 to be turned off at this time. Now, the pull-up node PU is still at a high level, and the output transistor M3 maintains turned on. The first pull-down transistor M6 is turned on under the control of the pull-up node PU, and controls the pull-down node PD to be at a low level. Meanwhile, the signal input by the first clock signal terminal CLK is a high level signal. Therefore, the signal output terminal OUTPUT outputs the high level signal at the moment.

Third phase (reset phase): the backward scanning input terminal INPUT2 is input a high level signal, the first forward scanning reset transistor M15 and the second forward scanning reset transistor M16 are turned on under the control the high level signal input by the backward scanning input terminal and the high level signal input by the forward scanning control terminal. At this time, the low level signal input by the backward scanning control terminal VSD pulls down the potential of the pull-up node PU through the first forward scanning reset transistor M15 and the second forward scanning reset transistor M16, so as to complete resetting of the pull-up node PU. At the same time, since the signal of the first control signal terminal GCH is at a high level, the first pull-down control transistor M5 and the second pull-down control transistor M9 are turned on, the potential of the pull-down node PD is pulled to the high level, and discharging of the output capacitor C1 and the signal output terminal OUTPUT is accelerated through the first noise reduction transistor M10 and the second noise reduction transistor M11.

Fourth phase (noise reduction phase): the pull-down node PD maintains at a low level, the first noise reduction transistor M10 and the second noise reduction transistor M11 maintains turned on, and the pull-up node PU and the signal output terminal OUTPUT maintains at a low level.

After scanning of one frame ends up, the low level input by the second control signal terminal GCL is converted into the high level, so that the output reset transistor M7 is turned on, so as to reset the signal output by the signal output terminal OUTPUT as the low level.

Backward scanning: the forward scanning control signal input by the forward scanning control terminal VDS is a constant low signal; the backward scanning control signal input by the backward scanning control terminal VSD is a constant high signal.

First phase (pre-charge phase): the backward scanning input terminal INPUT2 is input a high level signal, the backward scanning control terminal VSD is input a high level signal, and both the second backward scanning input transistor M2 and the first backward scanning input transistor M4 are turned on. At this time, the pull-up node PU is pre-charged by the high level signal input by the backward scanning control terminal, and at the same time, the output capacitor C1 is charged, and the output transistor M3 is turned on by the high level of the pull-up node PU. At this time, the low level signal input by the first clock signal terminal CLK is output by the signal output terminal OUTPUT.

Second phase (output phase): the signal input by the backward scanning input signal terminal INPUT2 changes from the high level into the low level, the second forward scanning input transistor M1 is turned off at this time, the output capacitor C1 is discharged, the pull-up node PU is bootstrapped, and is still at the high level, the output transistor M3 maintains turned on, the first pull-down transistor M6 is turned on, and the pull-down node PD is at the low level; at the same time, the signal input by the first clock signal terminal CLK is the high level signal, and thus the signal output terminal OUTPUT outputs the high level signal at this time.

Third phase (reset phase): the signal input by the forward scanning input terminal INPUT1 is the high level signal, and both the first backward scanning input transistor M13 and the second backward scanning input transistor M14 are turned on. At this time, the low level signal input by the forward scanning control terminal VDS pulls down the potential of the pull-up node PU through the first backward scanning input transistor M13 and the second backward scanning input transistor M14, so as to complete resetting of the pull-up node PU. At the same time, the signal of the first control signal terminal GCH is at the high level, the first pull-down control transistor M5 and the second pull-down control transistor M9 are turned on, and the potential of the pull-down node PD is pulled to the high level. At this time, the first noise reduction transistor M10 and the second noise reduction transistor M11 accelerate discharging of the output capacitor C1 and the signal output terminal OUTPUT.

Fourth phase (noise reduction phase): the pull-down node PD maintains at the low level, the first noise reduction transistor M10 and the second noise reduction transistor M11 maintain turned on, and the pull-up node PU and the signal output terminal OUTPUT maintain at the low level.

After scanning of one frame ends up, the input of the second control signal terminal GCL is converted from the low level into the high level, so that the output reset transistor M7 is turned on, so as to reset the signal output by the signal output terminal OUTPUT as the low level.

In the driving method of the shift register of the present embodiment, transistors adopted in the forward scanning pre-charge phase are the first forward scanning input transistor M1 and the second forward scanning input transistor M12, transistors adopted in the backward scanning pre-charge phase are the second backward scanning input transistor M2 and the first backward scanning input transistor M4, transistors adopted in the forward scanning reset phase are the first forward scanning reset transistor M15 and the second forward scanning reset transistor M16, and transistors adopted in the backward scanning reset phase are the first backward scanning input transistor M13 and the second backward scanning input transistor M14, so that the input signal and the reset signal are switched into different circuits upon scanning forwards and scanning backwards, so as to guarantee that current directions of transistors for scanning backwards are unchanged in the operation state, so as to solve the problem of poor reliability in horizontal strip in the shift register.

Figure 6:
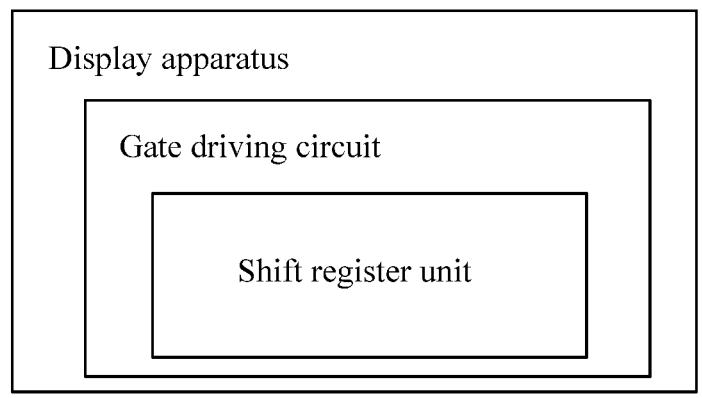
FIG. 6 shows an exemplary display apparatus according to an embodiment of the present disclosure.

FIG. 6 shows an exemplary display apparatus according to an embodiment of the present disclosure.

As shown in FIG. 6, there is provided in the present embodiment a gate driving circuit, comprising the shift register unit as described above.

Correspondingly, there is further disclosed in the present embodiment a display apparatus, comprising the gate driving circuit as described above. The display apparatus may be any product or component having a function of displaying such as a mobile phase, a tablet computer, a television set, a display, a notebook computer, a digital photo frame, a navigator, and so on.

Of course, the display apparatus of the present embodiment can further comprise other general mechanisms, such as a power supply unit, a display driving unit, and so on.

It can be understood that the above implementations are just exemplary embodiments adopted for describing principles of the present disclosure. However, the present disclosure is not limited thereto. For those ordinary skilled in the art, various modifications and improvements can be made without departing the spirit and substance of the present disclosure. These modifications and improvements can be regarded as the protection scope of the present disclosure.

What is claimed is:

1. A shift register, comprising:
   a forward scanning input sub-circuit for pre-charging a potential of a pull-up node by an operation level signal under control of a forward input signal and a forward scanning signal during forward scanning;
   a backward scanning input sub-circuit for pre-charging the potential of the pull-up node by an operation level signal under control of a backward input signal and a backward scanning signal during backwards scanning;
   an output sub-circuit for outputting a clock signal through a signal output terminal under control of the potential of the pull-up node;
   wherein the pull-up node is a connection node of the forward scanning input sub-circuit, the backward scanning input sub-circuit and the output sub-circuit,
   said shift register further comprising:
   a forward scanning reset sub-circuit for resetting the pull-up node by a non-operation level signal under control of a forward reset signal and the forward scanning signal during forwards scanning,
   said forward scanning input sub-circuit and said forward scanning reset sub-circuit operate independently each other.

2. The shift register according to claim 1, further comprising:
   a backward scanning reset sub-circuit for resetting the pull-up node by the non-operation level signal under control of a backward reset signal and the backward scanning signal during backwards scanning.

3. The shift register according to claim 1, further comprising:
   a pull-down control sub-circuit for controlling a potential of a pull-down node under control of the operation level and the potential of the pull-up node;
   a pull-down sub-circuit for pulling down the potential of the pull-down node by the non-operation level signal under control of the potential of the pull-up node;
   a noise reduction sub-circuit for reducing an output noise of the pull-up node and the signal output terminal by the non-operation level signal under control of the pull-down node;
   wherein the pull-down node is a connection node of the pull-down control sub-circuit, the pull-down sub-circuit and the noise reduction sub-circuit.

4. The shift register according to claim 1, wherein the forward scanning input sub-circuit comprises: a first forward scanning input transistor and a second forward scanning input transistor; wherein
   a control electrode of the second forward scanning input transistor is connected to a forward scanning input terminal, a first electrode of the second forward scanning input transistor is connected to a second electrode of the first forward scanning input transistor, and a second electrode of the second forward scanning input transistor is connected to the pull-up node;
   a control electrode of the first forward scanning input transistor is connected to a first electrode thereof and is connected to a forward scanning control terminal.

5. The shift register according to claim 1, wherein the backward scanning input sub-circuit comprises: a first backward scanning input transistor and a second backward scanning input transistor; wherein
   a control electrode of the first backward scanning input transistor is connected to a first electrode thereof, and is connected to a backward scanning control terminal;
   a control electrode of the second backward scanning input transistor is connected to a backward scanning input terminal, a first electrode of the second backward scanning input transistor is connected to a second electrode of the first backward scanning input transistor, and a second electrode of the second backward scanning input transistor is connected to the pull-up node.

6. The shift register according to claim 2, wherein the forward scanning reset sub-circuit comprises: a first forward scanning reset transistor and a second forward scanning reset transistor; wherein
a first electrode of the first forward scanning reset transistor is connected is to the pull-up node, a second electrode of the first forward scanning reset transistor is connected to a first electrode of the second forward scanning reset transistor, and a control electrode of the first forward scanning reset transistor is connected to the backward scanning input terminal;
a first electrode of the second forward scanning reset transistor is connected to the second electrode of the first forward scanning reset transistor, a second electrode of the second forward scanning reset transistor is connected to the backward scanning control terminal, and a control electrode of the second forward scanning reset transistor is connected to the forward scanning control terminal.

7. The shift register according to claim 2, wherein the backward scanning reset sub-circuit comprises: a first backward scanning reset transistor and a second backward scanning reset transistor; wherein
a first electrode of the first backward scanning reset transistor is connected to a second electrode of the second backward scanning reset transistor, a second electrode of the first backward scanning reset transistor is connected to the pull-up node, and a control electrode of the first backward scanning reset transistor is connected to the forward scanning input terminal;
a first electrode of the second backward scanning reset transistor is connected to the forward scanning control terminal, a second electrode of the second backward scanning reset transistor is connected to the first electrode of the first backward scanning reset transistor, and a control electrode of the second backward scanning reset transistor is connected the backward scanning control terminal.

8. The shift register according to claim 1, wherein the output sub-circuit comprises an output transistor and an output capacitor; wherein
a control electrode of the output transistor is connected to the pull-up node, a first terminal of the output transistor is connected to a first clock signal terminal, and a second terminal of the output transistor is connected to an output terminal;
a first terminal of the output capacitor is connected to the pull-up node, and a second terminal of the output capacitor is connected to the output terminal.

9. The shift register according to claim 3, wherein the pull-down control sub-circuit comprises a first pull-down control transistor and a second pull-down control transistor; wherein
a first electrode of the first pull-down control transistor is connected to a first electrode of the second pull-down control transistor, a second electrode of the first pull-down control transistor is connected to the pull-down node, and a control electrode of the first pull-down control transistor is connected to a second electrode of the second pull-down control transistor;
both the first electrode and a control electrode of the second pull-down control transistor are connected to a first control signal terminal, and the second electrode of the second pull-down control transistor is connected to the control electrode of the first pull-down control transistor and the pull-down sub-circuit.

10. The shift register according to claim 3, wherein the pull-down sub-circuit comprises: a first pull-down transistor and a second pull-down transistor; wherein
a first electrode of the first pull-down transistor is connected to the pull-down node, a second electrode of the first pull-down transistor is connected to a low level terminal, and a control electrode of the first pull-down transistor f is connected to the pull-up node;
a first electrode of the second pull-down transistor is connected to the pull-down control sub-circuit, a second electrode of the second pull-down transistor is connected to the low level terminal, and a control electrode of the second pull-down transistor is connected to the pull-up node.

11. The shift register according to claim 3, wherein the noise reduction sub-circuit comprises: a first noise reduction transistor and a second noise reduction transistor;
wherein a first electrode of the first noise reduction transistor is connected to the pull-up node, a second electrode of the first noise reduction transistor is connected to a second control signal terminal, and a control electrode of the first noise reduction transistor is connected to the pull-down node;
a first electrode of the second noise reduction transistor is connected to the pull-up node, a second electrode of the second noise reduction transistor is connected to the second control signal terminal, and a control electrode of the second noise reduction transistor is connected to the pull-down node.

12. The shift register according to claim 1, further comprising: an output reset sub-circuit for resetting a signal output by the signal output terminal by the non-operation level signal under control of a second control signal after scanning of each frame ends up.

13. The shift register according to claim 12, wherein the output reset sub-circuit comprises: an output reset transistor, wherein
a first electrode of the output reset transistor is connected to the signal output terminal, a second electrode of the output reset transistor is connected to a low level signal terminal, and a control electrode of the output reset transistor is connected to the second control signal terminal.

14. A driving method of the shift register according to claim 1, comprising:
in a forward scanning pre-charge phase, pre-charging a pull-up node by adopting a forward scanning input sub-circuit;
in a backward scanning pre-charge phase, pre-charging the pull-up node by adopting a backward scanning input sub-circuit.

15. The driving method of the shift register according to claim 14, further comprising:
in a forward scanning reset phase, resetting the pull-up node by adopting a forward scanning reset sub-circuit;
in a backward scanning reset phase, resetting the pull-up node by adopting a backward scanning reset sub-circuit.

16. The driving method of the shift register according to claim 14, wherein the forward scanning pre-charge phase comprises:
controlling the forward scanning input sub-circuit to be turned on by a forward input signal provided by a first signal terminal and an operation level signal provided by a forward scanning control terminal, and pre-charging the pull-up node by the operation level signal provided by the forward scanning control terminal;

the backward scanning pre-charging phase comprises:

controlling the backward scanning input sub-circuit to be turned on by a backward input signal provided by a second signal terminal and an operation level signal provided by the backward scanning control terminal, and pre-charging the pull-up node by the operation level signal provided by the backward scanning control terminal.

17. The driving method of the shift register according to claim 15, wherein the forward scanning reset phase comprises:

controlling the forward scanning reset sub-circuit to be turned on by a forward reset signal provided by the second signal terminal and the operation level signal provided by the forward scanning control terminal, and resetting the pull-up node by a non-operation level signal provided by the backward scanning control terminal;

the backward scanning reset phase comprises:

controlling the backward scanning reset sub-circuit to be turned on by a backward reset signal provided by the first signal terminal and an operation level signal provided by the backward scanning control terminal, and resetting the pull-up node by a non-operation level signal provided by the forward scanning control terminal.

18. A gate driving circuit, comprising multiple shift registers connected in cascades, wherein the shift register is the shift register according to claim 1.

19. A display apparatus, comprising the gate driving circuit according to claim 18.

* * * * *